(12) United States Patent
Hattori et al.

(10) Patent No.: US 9,095,073 B2
(45) Date of Patent: Jul. 28, 2015

(54) MOUNTING LAND STRUCTURE AND MOUNTING STRUCTURE FOR LAMINATED CAPACITOR

(71) Applicant: Murata Manufacturing Co., Ltd., Nagaokakyo-shi, Kyoto-fu (JP)

(72) Inventors: Kazuo Hattori, Nagaokakayo (JP); Isamu Fujimoto, Nagaokayo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 127 days.

(21) Appl. No.: 13/959,949

(22) Filed: Aug. 6, 2013

(65) Prior Publication Data

US 2014/0041914 A1 Feb. 13, 2014

(30) Foreign Application Priority Data

Aug. 10, 2012 (JP) .................. 2012-177640
May 13, 2013 (JP) .................. 2013-101185

(51) Int. Cl.
*H05K 1/16* (2006.01)
*H05K 1/18* (2006.01)
(Continued)

(52) U.S. Cl.
CPC .............. *H05K 1/181* (2013.01); *H01G 2/065* (2013.01); *H01G 4/12* (2013.01); *H01G 4/232* (2013.01);
(Continued)

(58) Field of Classification Search
CPC ........... H05K 1/181; H05K 3/36; H05K 1/16; H05K 3/34; H05K 3/42; H05K 5/00; H01G 4/22; H01G 2/00; H01G 4/30; H01G 4/252; H01G 3/08; H01G 1/035; H01G 2/06; H01G 4/12; H01C 1/14; H01C 7/00; B23K 31/00; B23K 31/02; G06F 17/10
USPC ................. 174/52.1, 260; 29/840, 852; 703/2
See application file for complete search history.

(56) References Cited

U.S. PATENT DOCUMENTS 5,083,237 A * 1/1992 Tsuji .............................. 361/765
2002/0038723 A1* 4/2002 Takeda ........................ 174/260
(Continued)

FOREIGN PATENT DOCUMENTS

JP 04-314389 A 11/1992
JP 05055084 A * 3/1993 ............... H01G 4/30
(Continued)

OTHER PUBLICATIONS

Hattori et al., "Capacitor Component and Capacitor Component Mounting Structure", U.S. Appl. No. 13/959,938, filed Aug. 6, 2013.

*Primary Examiner* — Timothy Thompson
*Assistant Examiner* — Guillermo Egoavil
(74) *Attorney, Agent, or Firm* — Keating & Bennett, LLP

(57) ABSTRACT

A mounting land structure and a mounting structure include land patterns to be bonded to outer electrodes of a laminated ceramic capacitor. Each of the land patterns includes a first conductor pattern and a second conductor pattern separated from each other in a width direction and a third conductor pattern connecting the first conductor pattern and the second conductor pattern. The first conductor pattern and the second conductor pattern include respective portions to be bonded to first ridgeline portions of the laminated ceramic capacitor provided with the outer electrodes. The third conductor pattern is arranged at a position overlapping the corresponding outer electrode as viewed in a height direction, when the laminated ceramic capacitor is mounted.

18 Claims, 7 Drawing Sheets

(51) Int. Cl.
*H01G 4/30* (2006.01)
*H05K 1/11* (2006.01)
*H05K 3/34* (2006.01)
*H01G 2/06* (2006.01)
*H01G 4/12* (2006.01)
*H01G 4/232* (2006.01)

(52) U.S. Cl.
CPC ............... *H01G 4/30* (2013.01); *H05K 1/111* (2013.01); *H05K 3/3442* (2013.01); *H05K 2201/09381* (2013.01); *H05K 2201/10015* (2013.01); *H05K 2201/10636* (2013.01); *H05K 2201/2036* (2013.01); *H05K 2201/2045* (2013.01)

(56) References Cited

U.S. PATENT DOCUMENTS

| | | | |
|---|---|---|---|
| 2002/0040810 A1* | 4/2002 | Laffoley | 174/255 |
| 2007/0114057 A1* | 5/2007 | Matsuda | 174/260 |
| 2007/0121275 A1 | 5/2007 | Takashima et al. | |
| 2010/0091429 A1* | 4/2010 | Koga et al. | 361/321.2 |
| 2010/0094607 A1* | 4/2010 | Shepherd et al. | 703/2 |

FOREIGN PATENT DOCUMENTS

| | | | | |
|---|---|---|---|---|
| JP | 08-55752 A | | 2/1996 | |
| JP | 2001-068841 A | | 3/2001 | |
| JP | 2009130147 A | * | 6/2009 | ............... H01G 2/06 |
| KR | 10-2007-0053800 A | | 5/2007 | |

* cited by examiner

MOUNTING LAND STRUCTURE AND MOUNTING STRUCTURE FOR LAMINATED CAPACITOR

BACKGROUND OF THE INVENTION

1. Field of the Invention

The present invention relates to a mounting land structure and a mounting structure that mounts a laminated capacitor including inner electrodes and dielectric layers that are alternately laminated.

2. Description of the Related Art

A chip component, particularly a laminated ceramic capacitor, is often used in a mobile terminal device, such as a cellular phone, and a variety of electronic apparatuses, such as a personal computer. The laminated ceramic capacitor is configured to include a substantially rectangular component body including inner electrodes and dielectric ceramics that are alternately laminated and outer electrodes provided on mutually facing opposite ends of the component body.

The outer electrodes are directly mounted on mounting lands of a circuit substrate of an electronic apparatus, and the mounting lands and the outer electrodes are bonded together by a bonding agent, such as solder. Thereby, the laminated ceramic capacitor is electrically and physically connected to the circuit substrate.

When an alternating-current voltage or a direct-current voltage superimposed with an alternating-current component is applied to such a laminated ceramic capacitor, vibration due to a mechanical strain is generated in the laminated ceramic capacitor by the piezoelectric effect and the electrostrictive effect of the dielectric ceramics. The vibration of the laminated ceramic capacitor is transmitted to the circuit substrate, and the circuit substrate vibrates. The vibration of the circuit substrate may produce vibration sound (hereinafter referred to as acoustic noise) that is audible to the human ear.

As a configuration to address this issue, Japanese Unexamined Patent Application Publication No. 8-55752, for example, indicates that a laminated ceramic capacitor is mounted on a substrate with the planes of inner electrodes oriented substantially perpendicular to a mounting surface of the substrate, to thereby prevent the substrate from directly receiving vibration of the laminated ceramic capacitor caused by repeated expansion and contraction of dielectric ceramics in the thickness direction thereof (lamination direction of the inner electrodes) due to the application of a voltage and, thus, reduce the acoustic noise.

However, the laminated capacitor vibrates not only in the lamination direction of the inner electrodes but also in the planar direction of the inner electrodes. In some cases, therefore, the configuration according to Japanese Unexamined Patent Application Publication No. 8-55752 fails to suppress the acoustic noise depending on the circuit substrate. The inventors of the present invention have discovered that the acoustic noise changes depending on the position of the outer electrodes bonded to the circuit substrate.

SUMMARY OF THE INVENTION

Preferred embodiments of the present invention provide a mounting land structure and a mounting structure for a laminated capacitor that significantly reduces or prevents the acoustic noise.

A mounting structure for a laminated capacitor according to a preferred embodiment of the present invention includes a laminated capacitor and a substrate. The laminated capacitor includes a rectangular or substantially rectangular parallelepiped-shaped base body and outer electrodes. The base body includes a top surface and a bottom surface facing each other, a pair of end surfaces perpendicular or substantially perpendicular to the top surface and the bottom surface and facing each other, and a pair of side surfaces perpendicular or substantially perpendicular to the bottom surface and the end surfaces and facing each other. The outer electrodes respectively extend from the end surfaces to the bottom surface of the base body. The substrate includes a mounting surface, a first land pattern, and a second land pattern. The laminated capacitor is mounted on the mounting surface with the bottom surface facing the mounting surface. The first land pattern and the second land pattern are provided on the mounting surface so as to be bonded to the outer electrodes.

In the mounting structure for a laminated capacitor according to this preferred embodiment of the present invention, each of the first land pattern and the second land pattern preferably includes a first conductor pattern and a second conductor pattern that are separated from each other in a direction of connecting the side surfaces and a third conductor pattern disposed between the first conductor pattern and the second conductor pattern. The first conductor pattern and the second conductor pattern are bonded to first ridgeline portions of the corresponding outer electrode provided on the bottom surface and overlapping the side surfaces as viewed in a direction perpendicular or substantially perpendicular to the top surface. The third conductor pattern overlaps the corresponding outer electrode as viewed in a direction perpendicular or substantially perpendicular to the mounting surface. The first conductor pattern, the second conductor pattern, and the third conductor pattern are arranged so as not to overlap a center portion of a side of the corresponding outer electrode on the side of the corresponding end surface as viewed in the direction perpendicular or substantially perpendicular to the mounting surface.

With this configuration, the laminated capacitor is fixed on the substrate at the first ridgeline portions. The first ridgeline portions refer to lines defined by a mounting surface of each of the outer electrodes mounted on the substrate and opposite side surfaces of the outer electrode (a pair of surfaces thereof perpendicular or substantially perpendicular to the mounting surface). When a mechanical strain is generated in the mounted laminated capacitor, the displacement amount due to the strain is small in the first ridgeline portions. With the laminated capacitor fixed on the substrate at the first ridgeline portions in which the displacement amount is small, the transmission of the strain of the laminated capacitor to the substrate is significantly reduced or prevented. Accordingly, it is possible to greatly reduce or prevent the acoustic noise produced by the vibration of the substrate.

Preferably, the first conductor pattern and the second conductor pattern are configured to be bonded to corner portions defined by the first ridgeline portions and a second ridgeline portion of the corresponding outer electrode provided on the bottom surface and overlapping the corresponding end surface as viewed in the direction perpendicular or substantially perpendicular to the top surface.

The second ridgeline portion refers to a line defined by the mounting surface of each of the outer electrodes mounted on the substrate and an end surface of the outer electrode.

With this configuration, the displacement amount due to the strain is significantly reduced in the corner portions defined by the first ridgeline portions and the second ridgeline portion.

Further, preferably, the third conductor pattern is configured to be connected to at least one of the first conductor pattern and the second conductor pattern.

With the third conductor pattern configured to be connected to at least one of the first conductor pattern and the second conductor pattern, solder applied to the first or second conductor pattern when the laminated capacitor is mounted on the first and second conductor patterns by soldering flows to the third conductor pattern connected to the first or second conductor pattern. As a result, the height of a solder fillet is reduced. If the height of the solder fillet is increased, the mechanical strain generated in the laminated capacitor is transmitted to the substrate via the solder fillet. However, with the reduction in height of the solder fillet due to the third conductor pattern, it is possible to significantly reduce or prevent the transmission of the vibration and greatly reduce the acoustic noise.

Further, each of the first land pattern and the second land pattern may preferably be configured to include a conductor non-forming region having a circular or substantially circular arc shape and surrounded by the first conductor pattern, the second conductor pattern, and the third conductor pattern as viewed in the direction perpendicular or substantially perpendicular to the mounting surface.

Further, the substrate may preferably be configured to include grooves each having substantially the same shape as the circular or substantially circular arc shape and located immediately under the conductor non-forming region.

With this configuration, the laminated capacitor is mounted on a region of the mounting surface of the substrate excluding the conductor non-forming region (region including the first land pattern and the second land pattern, for example). That is, the laminated capacitor is mounted on the substrate via an interposer corresponding to a region excluding the conductor non-forming region. Also with this configuration, the transmission of the vibration to the interposer is significantly reduced or prevented. Accordingly, it is possible to further reduce the acoustic noise.

Further, it is preferable that the base body of the laminated capacitor is configured to include therein substantially flat plate-shaped inner conductors, the planes of which are perpendicular or substantially perpendicular to the mounting surface of the substrate.

Irrespective of the mode of displacement of the inner conductors, the laminated capacitor is fixed on the substrate at the first ridgeline portions in which the displacement amount due to the strain is small. Accordingly, the transmission of the vibration to the substrate is significantly reduced or prevented.

Preferred embodiments of the present invention are not limited to the mounting structure for a laminated capacitor. Another preferred embodiment of the present invention may include a mounting land structure including a substrate, a first land pattern, and a second land pattern. The substrate includes a mounting surface mounted with a laminated capacitor. The laminated capacitor includes a rectangular or substantially rectangular parallelepiped-shaped base body and outer electrodes. The base body includes a top surface and a bottom surface facing each other, a pair of end surfaces perpendicular or substantially perpendicular to the top surface and the bottom surface and facing each other, and a pair of side surfaces perpendicular or substantially perpendicular to the bottom surface and the end surfaces and facing each other. The outer electrodes respectively extend from the end surfaces to the bottom surface of the base body. The first land pattern and the second land pattern are provided on the mounting surface to be bonded to the outer electrodes.

According to various preferred embodiments of the present invention, the laminated capacitor is fixed on the substrate at the first ridgeline portions in which the displacement amount due to a mechanical strain generated in the mounted laminated capacitor is small. As a result, the transmission of the strain of the laminated capacitor to the substrate is significantly reduced or prevented. Consequently, it is possible to significantly reduce or prevent the acoustic noise produced by the vibration of the substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

With reference to the drawings, a description will be provided below of a mounting land structure and a mounting structure for a laminated capacitor according to preferred embodiments of the present invention.

First Preferred Embodiment

Figure 1A:
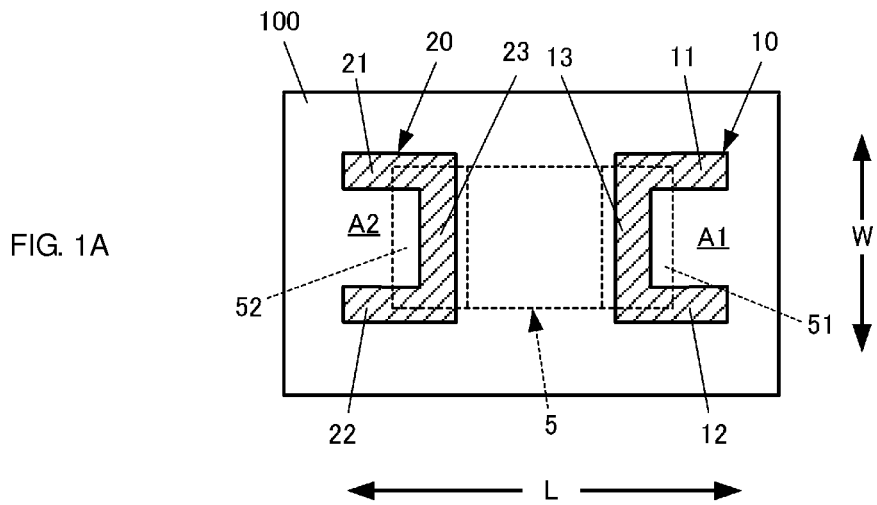
FIG. 1A is a plan view of a substrate according to a first preferred embodiment of the present invention including land patterns.
Figure 1B:
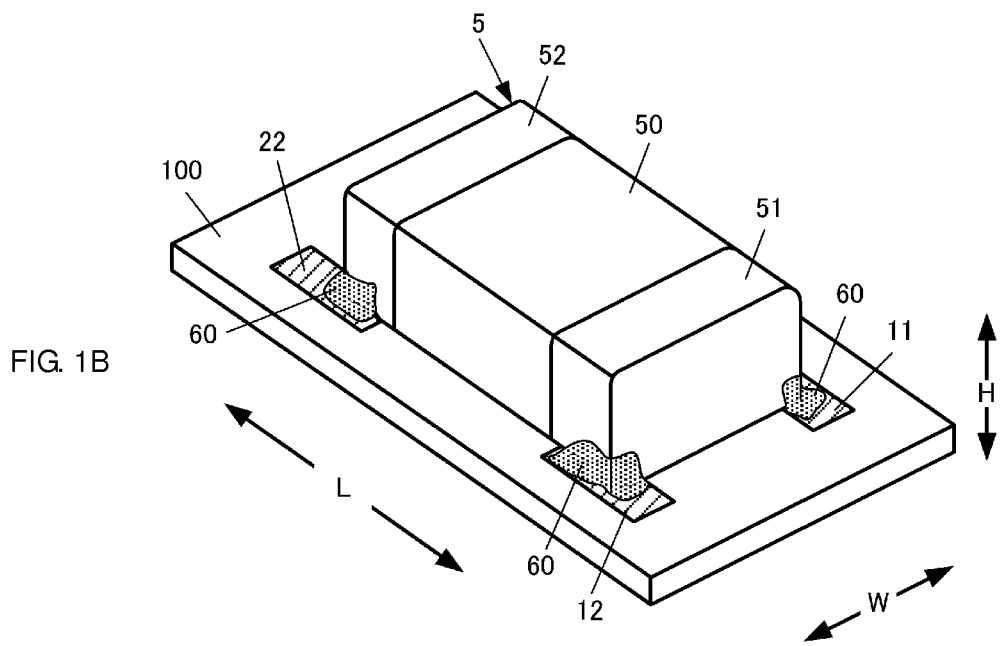
FIG. 1B is a perspective view of a state in which a laminated ceramic capacitor is mounted on the substrate.

FIG. 1A is a plan view of a substrate according to a first preferred embodiment of the present invention including land patterns. FIG. 1B is a perspective view of a state in which a laminated ceramic capacitor is mounted on the substrate.

A substrate 100 is preferably made of an insulating resin, for example, and includes a mounting surface mounted with a laminated ceramic capacitor 5 and a plurality of other electronic components. The substrate 100 illustrated in FIGS. 1A and 1B is a portion of an insulating substrate including a plurality of electronic components mounted thereon. The substrate 100 may be a circuit substrate, or may be an interposer disposed between a circuit substrate and electronic components.

An arrow L illustrated in FIGS. 1A and 1B corresponds to the length direction of the laminated ceramic capacitor 5 mounted on the substrate 100. Further, an arrow W corresponds to the width direction of the laminated ceramic capacitor 5, and an arrow H corresponds to the height direction of the laminated ceramic capacitor 5 (direction perpendicular or substantially perpendicular to the mounting surface).

The laminated ceramic capacitor 5 will be described first. In the laminated ceramic capacitor 5, inner electrodes and ceramic layers are alternately laminated. In the present preferred embodiment, the laminated ceramic capacitor 5 may be mounted on the substrate 100 such that the inner electrodes are perpendicular or substantially perpendicular to the mounting surface of the substrate 100, or that the inner electrodes are parallel or substantially parallel to the mounting surface.

The inner electrodes and the mounting surface may not be completely perpendicular or parallel to each other, and may be substantially perpendicular or parallel to each other. Herein, the term "substantially perpendicular" is not limited to the state in which the angle between the mounting surface and the inner electrodes is 90°, and the term "substantially parallel" is not limited to the state in which the angle between the mounting surface and the inner electrodes is 180°. Each of the terms includes an acceptable range of error depending on the manufacturing or mounting accuracy of components.

Figure 2A:
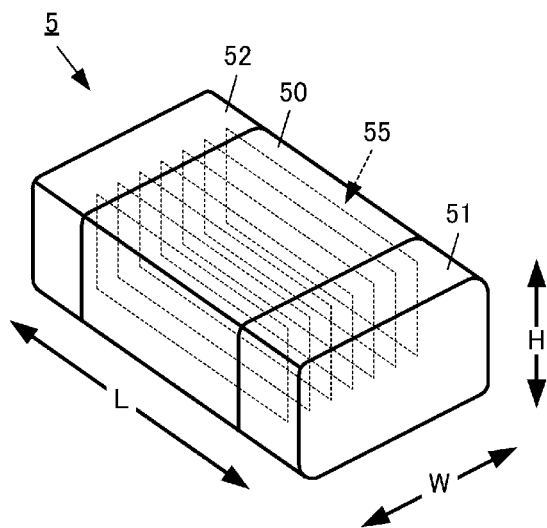
FIG. 2A is a partial perspective view of a laminated ceramic capacitor including inner electrodes perpendicular or substantially perpendicular to a mounting surface.
Figure 2B:
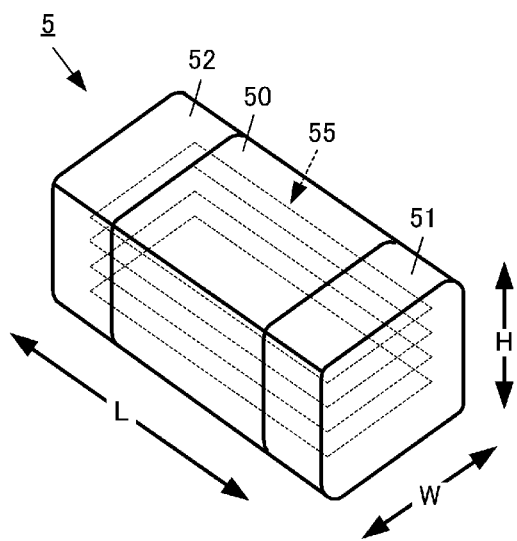
FIG. 2B is a partial perspective view of a laminated ceramic capacitor including inner electrodes parallel or substantially parallel to a mounting surface.

FIG. 2A is a partial perspective view of the laminated ceramic capacitor 5 including the inner electrodes that are perpendicular or substantially perpendicular to the mounting surface. FIG. 2B is a partial perspective view of the laminated ceramic capacitor 5 including the inner electrodes that are parallel or substantially parallel to the mounting surface.

The laminated ceramic capacitor 5 includes a laminate 50. The laminate 50 is preferably a ceramic laminate preferably having a rectangular or substantially rectangular parallelepiped shape. A substantially rectangular parallelepiped shape is not limited to a complete rectangular parallelepiped shape, and includes, for example, an acceptable range of shapes to ensure desired performance of the electronic component. The laminate 50 preferably includes substantially rectangular inner electrodes 55 each having a flat or substantially flat plate shape, and the inner electrodes 55 and ceramic layers (dielectric layers) are alternately laminated. The inner electrodes 55 of the laminate 50 include inner electrodes each exposed on one of opposite end portions thereof in the longitudinal direction and inner electrodes each exposed on the other end portion, which are alternately laminated.

In the laminated ceramic capacitor 5 of FIG. 2A, the inner electrodes 55 are laminated such that the lamination direction thereof corresponds to the width direction W. Therefore, when the laminated ceramic capacitor 5 illustrated in FIG. 2A is mounted on the substrate 100, the inner electrodes 55 are substantially perpendicular to the mounting surface of the substrate 100.

In the laminated ceramic capacitor 5 of FIG. 2B, the inner electrodes 55 are laminated such that the lamination direction thereof corresponds to the height direction H. Therefore, when the laminated ceramic capacitor 5 illustrated in FIG. 2B is mounted on the substrate 100, the inner electrodes 55 are substantially parallel to the mounting surface of the substrate 100.

Opposite end portions of the laminate 50 facing each other along the longitudinal direction of the laminate 50 are provided with outer electrodes 51 and 52. The outer electrodes 51 and 52 are connected to the inner electrodes exposed from the opposite end portions. The outer electrodes 51 and 52 are arranged on opposite end surfaces in the length direction L of the laminate 50 to spread therefrom toward opposite side surfaces in the width direction W, a top surface, and a bottom surface of the laminate 50.

The outer electrodes 51 and 52 are preferably plated with a predetermined metal having corrosion resistance and conductivity. Further, the laminated ceramic capacitor 5 is preferably configured to have dimensions of about 3.2 mm in length by about 1.6 mm in width, about 2.0 mm in length by about 1.25 mm in width, about 1.6 mm in length by about 0.8 mm in width, about 1.0 mm in length by about 0.5 mm in width, or about 0.6 mm in length by about 0.3 mm in width, for example.

Returning to FIG. 1A, the mounting surface of the substrate 100 includes land patterns 10 and 20 provided thereon. The land patterns 10 and 20 respectively correspond to a first land pattern and a second land pattern according to a preferred embodiment of the present invention. The laminated ceramic capacitor 5 is mounted on the substrate 100, and the outer electrodes 51 and 52 of the laminated ceramic capacitor 5 are connected to the land patterns 10 and 20, respectively.

The land patterns 10 and 20 preferably have the same or substantially the same shape, and are disposed along the length direction L. Further, the land patterns 10 and are arranged to be line-symmetric with respect to the width direction W substantially perpendicular to the length direction L. The land patterns 10 and 20 preferably have the same or substantially the same configuration. Therefore, in the following description, the land pattern 10 will be described, and a reference numeral of the land pattern 10 will be followed by the corresponding reference numeral of the land pattern 20 given in parentheses.

The land pattern 10 (20) includes a first conductor pattern 11 (21), a second conductor pattern 12 (22), and a third conductor pattern 13 (23) each preferably having a rectangular or substantially rectangular shape. The first conductor pattern 11 (21) and the second conductor pattern 12 (22) are separated from each other in the width direction W and arranged to be substantially parallel to each other along the length direction L.

The distance between the first conductor pattern 11 (21) and the second conductor pattern 12 (22) is preferably the same or substantially the same as the length in the width direction W of the laminated ceramic capacitor 5 mounted on the substrate 100. Therefore, opposite end portions in the width direction W of the outer electrode 51 (52) of the laminated ceramic capacitor 5 are bonded to the first conductor pattern 11 (21) and the second conductor pattern 12 (22).

The first conductor pattern 11 (21) and the second conductor pattern 12 (22) may not be arranged substantially parallel to each other along the length direction L, and may be arranged so as to be at least partially connected to the corresponding corner portions of the laminated ceramic capacitor 5 when the laminated ceramic capacitor 5 is mounted on the substrate 100.

The third conductor pattern 13 (23) is provided along the width direction W and connected to respective end portions of the first conductor pattern 11 (21) and the second conductor pattern 12 (22) on the side of the land pattern 20 (10). That is, the third conductor pattern 13 (23) bridges the first conductor pattern 11 (21) and the second conductor pattern 12 (22). The third conductor pattern 13 (23) may not be connected to the first conductor pattern 11 (21) and the second conductor pattern 12 (22). Further, the third conductor pattern 13 (23) may be connected to only one of the first conductor pattern 11 (21) and the second conductor pattern 12 (22). As viewed in the direction perpendicular to the mounting surface of the substrate 100, the outer electrode 51 (52) of the mounted laminated ceramic capacitor 5 overlaps the third conductor pattern 13 (23), and a gap is provided between the first and second conductor patterns 11 and 12 (21 and 22) and an end surface of the outer electrode 51 (52) (a portion corresponding to an end surface of the laminate 50). In other words, a conductor non-forming region A1 (A2) surrounded by the first conductor pattern 11 (21), the second conductor pattern 12 (22), and the third conductor pattern 13 (23) has a shape including a portion located under the mounted laminated ceramic capacitor 5.

The laminated ceramic capacitor 5 is preferably bonded to the land patterns 10 and 20 by a bonding agent 60, such as solder, for example. The corner portions of the laminated ceramic capacitor 5 are bonded to the substrate 100 by the bonding agent 60. Each of the corner portions is defined by a first ridgeline portion and a second ridgeline portion. The first ridgeline portion corresponds to a portion of the outer electrode 51 (52) provided on the bottom surface of the laminate 50 and overlapping a side surface of the laminate 50 as viewed in the direction perpendicular to the top surface of the laminate 50. The second ridgeline portion corresponds to a portion of the outer electrode 51 (52) provided on the bottom surface of the laminate 50 and overlapping an end surface of the laminate 50 as viewed in the direction perpendicular to the top surface of the laminate 50.

When a mechanical strain is generated in the laminated ceramic capacitor 5, the strain is small in the corner portions of the laminated ceramic capacitor 5 and the surrounding portions thereof. Therefore, if the laminated ceramic capacitor 5 is fixed on the substrate 100 at the corner portions, the transmission of vibration due to the mechanical strain of the laminated ceramic capacitor 5 to the substrate 100 is significantly reduced or prevented. Accordingly, it is possible to greatly reduce or prevent acoustic noise of the substrate 100.

The above-described shape of the land patterns 10 and 20 is determined by the shape of a conductive metal, such as copper and/or the shape of a resist provided on a surface of the conductive metal. Further, the shape of the land patterns 10 and 20 is also determined by through-holes provided in the substrate 100 to pass through at least portions of the conductive metal.

Further, with the formation of the third conductor pattern 13 (23), the bonding agent 60 applied on the first conductor pattern 11 (21) and the second conductor pattern (22) flows to the third conductor pattern 13 (23). Therefore, it is possible to reduce the height of a solder fillet produced by the bonding agent 60. Accordingly, it is possible to minimize or prevent the transmission of the vibration generated in the laminated ceramic capacitor 5 to the substrate 100 via the solder fillet, and thus, further reduce the acoustic noise.

It is possible to further reduce the height of the solder fillet by increasing the width of the third conductor pattern 13 (23) to be greater than the width of each of the first conductor pattern 11 (21) and the second conductor pattern 12 (22).

The mechanical strain generated in the laminated ceramic capacitor 5 will be described below.

Figure 3A:
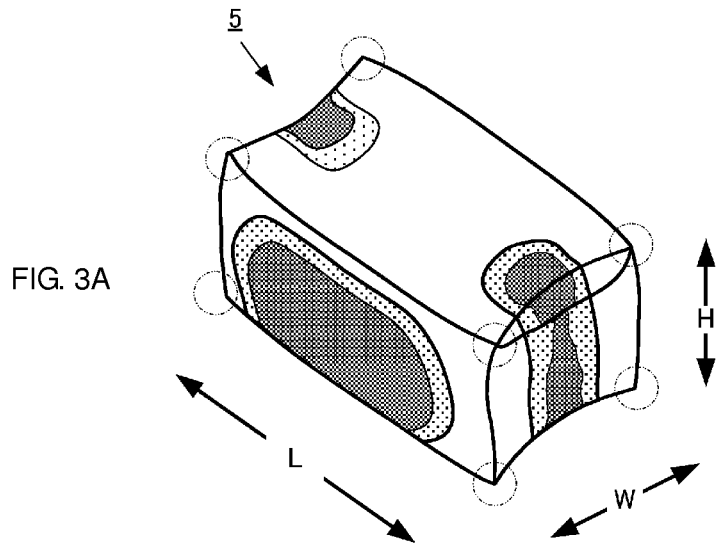
FIG. 3A is a schematic diagram to describe a strain of the laminated ceramic capacitor mounted with the inner electrodes disposed perpendicular or substantially perpendicular to the mounting surface.
Figure 3B:
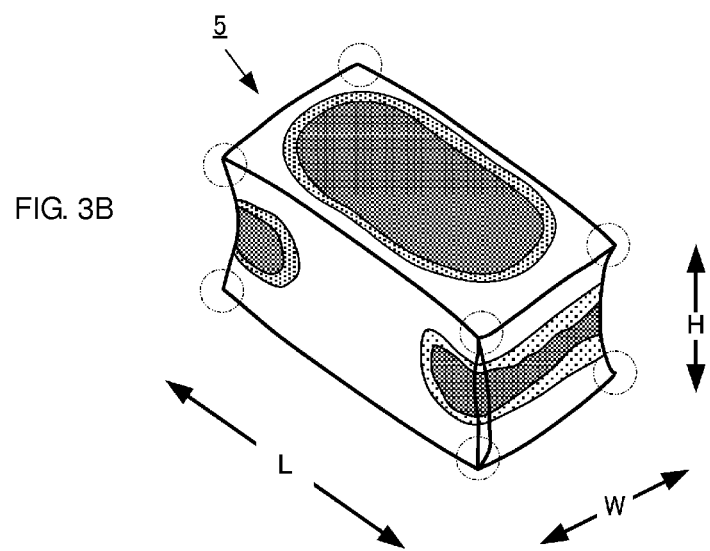
FIG. 3B is a schematic diagram to describe a strain of the laminated ceramic capacitor mounted with the inner electrodes disposed parallel or substantially parallel to the mounting surface.

FIG. 3A is a schematic diagram to describe the strain of the laminated ceramic capacitor 5 mounted with the inner electrodes 55 disposed substantially perpendicular to the mounting surface. FIG. 3B is a schematic diagram for describing the strain of the laminated ceramic capacitor 5 mounted with the inner electrodes 55 disposed substantially parallel to the mounting surface. In FIGS. 3A and 3B, the displacement amount is large in the dark shaded regions.

When a voltage is applied, a mechanical strain is generated in the dielectric layers interposed between the inner electrodes 55 due to the piezoelectric effect and the electrostrictive effect of ceramics, and the laminated ceramic capacitor 5 illustrated in FIG. 3A expands outward along the width direction W and contracts inward along the height direction H. The laminated ceramic capacitor 5 illustrated in FIG. 3B expands outward along the height direction H and contracts inward along the length direction L.

In both of the laminated ceramic capacitor 5 of FIG. 3A and the laminated ceramic capacitor 5 of FIG. 3B, the displacement is reduced in the first ridgeline portions each located at a position distant from the dielectric layers interposed between the inner electrodes 55, particularly in the corresponding corner portions (regions indicated by broken lines in the drawings) most distant from the dielectric layers. The displacement is also reduced in corner portions located above the above-described corner portions of the outer electrode 51 (52) in the height direction H. With the laminated ceramic capacitor 5 fixed on the substrate 100 at the first ridgeline portions, particularly at the corner portions, as illustrated in FIG. 1B, it is possible to reduce the vibration transmitted from the laminated ceramic capacitor 5 to the substrate 100, and thus, minimize or prevent the acoustic noise produced when the laminated ceramic capacitor 5 is strained.

A description will now be provided of dimensions of the land patterns 10 and 20 that provide a more effective reduction in acoustic noise of the substrate 100. The following description will be provided on the assumption that a laminated ceramic capacitor having dimensions of about 1.6 mm in length by about 0.8 mm in width by about 0.8 mm in height is used, for example.

Figure 4A:
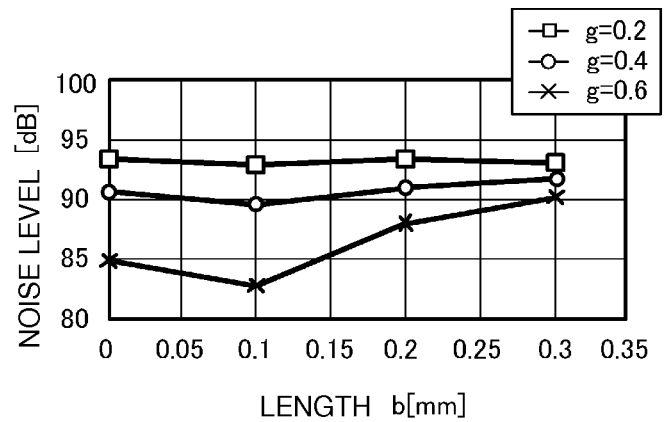
FIG. 4A is a diagram illustrating simulation results of the measurement of acoustic noise in a case in which the laminated ceramic capacitor is mounted with the inner electrodes disposed perpendicular or substantially perpendicular to the mounting surface.
Figure 4B:
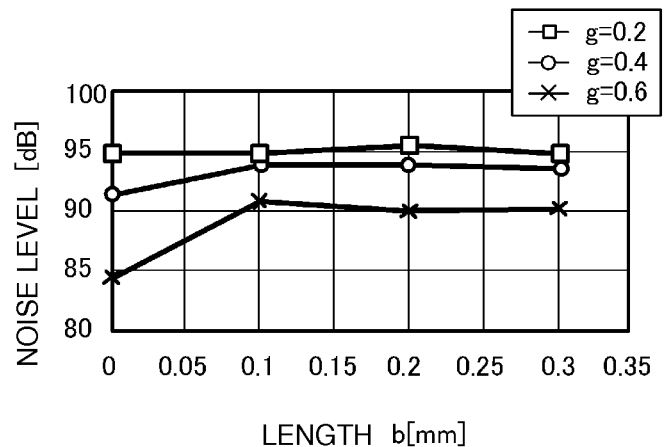
FIG. 4B is a diagram illustrating simulation results of the measurement of acoustic noise in a case in which the laminated ceramic capacitor is mounted with the inner electrodes disposed parallel or substantially parallel to the mounting surface.

FIG. 4A is a diagram illustrating simulation results of the measurement of acoustic noise in a case in which the laminated ceramic capacitor 5 is mounted with the inner electrodes 55 disposed substantially perpendicular to the mounting surface. FIG. 4B is a diagram illustrating simulation results of the measurement of acoustic noise in a case in which the laminated ceramic capacitor 5 is mounted with the inner electrodes 55 disposed substantially parallel to the mounting surface.

Figure 5:
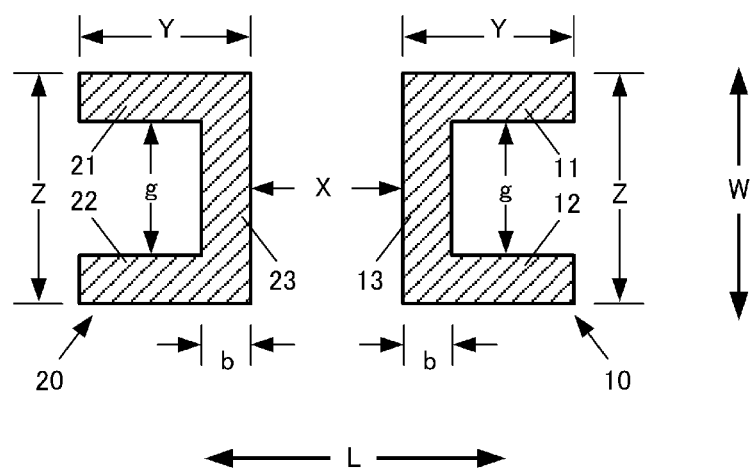
FIG. 5 is a diagram showing the dimensions of the land patterns.

FIG. 5 is a diagram for describing the dimensions of the land patterns 10 and 20. In the present preferred embodiment, a distance x between the land patterns 10 and 20 is preferably about 0.8 mm, for example. A length Y in the length direction L of each of the land patterns 10 and 20 is preferably about 0.6 mm and a length Z in the width direction W of each of the land patterns 10 and 20 is preferably about 0.8 mm, for example. Further, the gap between the first conductor pattern 11 (21) and the second conductor pattern 12 (22) will be referred to as the gap g, and the width of the third conductor pattern 13 (23) (length thereof along the length direction L) will be referred to as the length b.

The simulation results illustrated in FIGS. 4A and 4B correspond to the measurement results of acoustic noise for different values of the length b and the gap g. In FIGS. 4A and 4B, the horizontal axis represents the length b [mm], and the vertical axis represents the noise level [dB] of the substrate 100. The drawings illustrate changes in noise level for respective gap g values of about 0.2 mm, about 0.4 mm, and about 0.6 mm, for example.

If the gap g is increased, i.e., if the width of each of the first conductor pattern 11 (21) and the second conductor pattern 12 (22) is reduced, the area of bonding between the land patterns 10 and 20 and the laminated ceramic capacitor 5 is reduced. Therefore, the amount of the mechanical strain generated in the laminated ceramic capacitor 5 and transmitted to the substrate 100 is reduced. As illustrated in FIGS. 4A and 4B, therefore, it is possible to reduce the noise level of the acoustic noise of the substrate 100 in accordance with the increase of the gap g.

Further, it is understood from a comparison between FIGS. 4A and 4B that the configuration in which the laminated ceramic capacitor 5 is mounted with the inner electrodes 55 disposed substantially perpendicular to the mounting surface is capable of reducing the acoustic noise by about a few decibels to about ten decibels as compared with the configuration in which the laminated ceramic capacitor 5 is mounted with the inner electrodes 55 disposed substantially parallel to the mounting surface.

Further, the third conductor pattern 13 (23) is provided under the outer electrode 51 (52) of the laminated ceramic capacitor 5. With the increase of the gap g, i.e., with the formation of the third conductor pattern 13 (23), it is possible to ensure the bonding strength of the laminated ceramic capacitor 5. Therefore, it is possible to reduce the width of each of the first conductor pattern 11 (21) and the second conductor pattern 12 (22). Consequently, it is possible to further reduce the acoustic noise.

Second Preferred Embodiment

A second preferred embodiment of the present invention will be described below. The present preferred embodiment is different from the first preferred embodiment in that the land patterns 10 and 20 do not include the third conductor patterns 13 and 23, respectively. That is, in the land patterns 10 and 20 according to the present preferred embodiment, the length b described with reference to FIG. 5 is 0 mm. Even in this case, it is possible to reduce the noise level.

It is understood from FIGS. 4A and 4B that, when the length b is about 0 mm, the noise level is reduced in accordance with the increase of the gap g, i.e., in accordance with the reduction in width of the first conductor pattern 11 (21) and the second conductor pattern 12 (22).

It is possible to reduce the noise level of the acoustic noise by increasing the value of the gap g. However, the increase of the gap g, reduces the reliability of bonding between the land patterns 10 and 20 and the laminated ceramic capacitor 5. Therefore, it is preferable to set the gap g to a value allowing a reduction in noise level of the acoustic noise while ensuring the reliability of bonding between the land patterns 10 and 20 and the laminated ceramic capacitor 5.

First Modified Example

Figure 6:
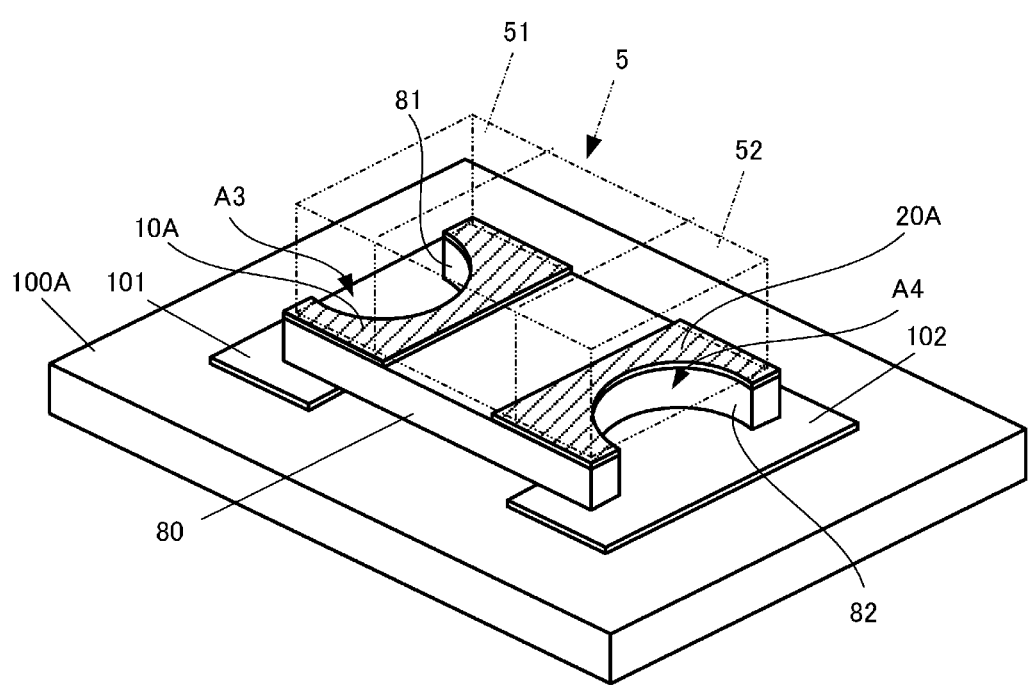
FIG. 6 is a perspective view of a state in which a laminated ceramic capacitor is mounted on an interposer provided with land patterns according to a first modified example of a preferred embodiment of the present invention.

With reference to FIG. 6, a description will be given of land patterns 10A and 20A, which provide a first modified example of the land patterns 10 and 20 according to a preferred embodiment of the present invention. FIG. 6 is a perspective view of a state in which the laminated ceramic capacitor 5 is mounted on an interposer provided with the land patterns 10A and 20A. In FIG. 6, the inner electrodes 55 and the solder are omitted.

The land patterns 10A and 20A are provided on an interposer 80 disposed between a circuit substrate 100A and the laminated ceramic capacitor 5.

The interposer 80 is disposed between the circuit substrate 100A and the laminated ceramic capacitor 5. The land patterns 10A and 20A are provided on the interposer 80. The land patterns 10A and 20A are preferably formed, for example, by forming rectangular or substantially rectangular land patterns and forming therein through-holes 81 and 82, which are circular or substantially circular arc-shaped grooves passing through the land patterns and the interposer 80. While the land patterns 10 and 20 of FIG. 1A respectively include the rectangular or substantially rectangular conductor non-forming regions A1 and A2, the land patterns 10A and 20A of FIG. 6 respectively include circular or substantially circular arc-shaped conductor non-forming regions A3 and A4 that are preferably the same or substantially the same in shape as the through-holes 81 and 82 of the interposer 80.

The laminated ceramic capacitor 5 is mounted on the interposer 80 such that the outer electrodes 51 and 52 are bonded to the land patterns 10A and 20A, respectively. Further, land patterns 101 and 102 to mount the interposer are provided on the circuit substrate 100A and bonded thereto by soldering, for example.

With this configuration, the laminated ceramic capacitor 5 is fixed on the interposer 80 at the first ridgeline portions of the laminated ceramic capacitor 5, particularly at the corner portions thereof, similarly to the foregoing preferred embodiments. Therefore, it is possible to reduce the vibration transmitted from the laminated ceramic capacitor 5 to the substrate 100A via the interposer 80, and thus, reduce the acoustic noise generated from the circuit substrate 100A when the laminated ceramic capacitor 5 is strained.

Further, the interposer 80 restricts swelling of wet solder (solder fillet) from the circuit substrate 100A to the laminated ceramic capacitor 5. Therefore, it is possible to reduce the acoustic noise. Further, since the land patterns 10A and 20A include the through-holes 81 and 82, respectively, the solder stays in the through-holes 81 and 82. As a result, the swelling of wet solder from the circuit substrate 100A to the laminated ceramic capacitor 5 is further restricted. Accordingly, it is possible to further reduce the acoustic noise. Further, the configuration including the laminated ceramic capacitor 5 mounted with the inner electrodes 55 disposed substantially perpendicular to the mounting surface is capable of reducing the acoustic noise to a greater extent than the configuration including the laminated ceramic capacitor 5 mounted with the inner electrodes 55 disposed substantially parallel to the mounting surface, and thus, is more preferable.

Second Modified Example

Figure 7:
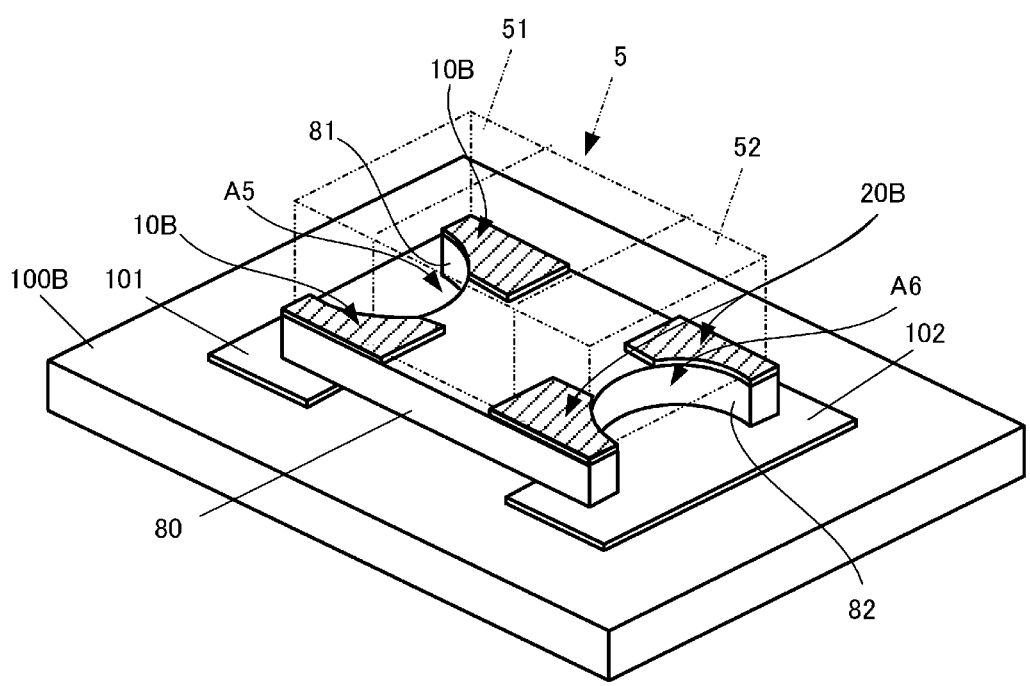
FIG. 7 is a perspective view of a state in which a laminated ceramic capacitor is mounted on an interposer provided with land patterns according to a second modified example of a preferred embodiment of the present invention.

With reference to FIG. 7, a description will be given of land patterns 10B and 20B, which provide a second modified example of the land patterns 10 and 20 according to a preferred embodiment of the present invention. FIG. 7 is a perspective view of a state in which the laminated ceramic capacitor 5 is mounted on the interposer 80 provided with the land patterns 10B and 20B. In FIG. 7, the inner electrodes 55 and the solder are omitted.

The land patterns 10B and 20B are provided on the interposer 80 disposed between a circuit substrate 100B and the laminated ceramic capacitor 5. Each of the land patterns 10B and 20B includes a first conductor pattern and a second conductor pattern, and does not include a third conductor pattern bridging the first conductor pattern and the second conductor pattern.

Each of the land patterns 10B and 20B is preferably formed by forming rectangular or substantially rectangular first and second conductor patterns and forming therein the through-hole 81 or 82, which is a circular or substantially circular arc-shaped groove passing through the first and second conductor patterns and the interposer 80. Each of the land patterns 10B and 20B has a shape partially following a circular or substantially circular arc shape that is substantially the same as the shape of the through-holes and 82 of the interposer 80. Each of conductor non-forming regions A5 and A6 has a circular or substantially circular arc shape including a rectangular or substantially rectangular projecting portion.

With this configuration, the laminated ceramic capacitor 5 is fixed on the interposer 80 at the first ridgeline portions of the laminated ceramic capacitor 5, particularly at the corner portions thereof, similarly to the first modified example. Therefore, it is possible to reduce the acoustic noise. Further, the interposer 80 restricts swelling of wet solder (solder fillet) from the circuit substrate 100B to the laminated ceramic capacitor 5. Therefore, it is possible to reduce the acoustic noise. Further, since the land patterns 10B and 20B include the through-holes 81 and 82, respectively, the solder stays in the through-holes 81 and 82. Thereby, the swelling of wet solder from the circuit substrate 100B to the laminated ceramic capacitor 5 is further restricted. Accordingly, it is possible to further reduce or prevent the acoustic noise.

Each of the land patterns 10B and 20B may preferably include a third conductor pattern not bridging the first conductor pattern and the second conductor pattern.

Further, the configuration including the laminated ceramic capacitor 5 mounted with the inner electrodes 55 disposed substantially perpendicular to the mounting surface is capable of reducing the acoustic noise to a greater extent than the configuration having the laminated ceramic capacitor 5 mounted with the inner electrodes 55 disposed substantially parallel to the mounting surface, and thus, is more preferable.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A mounting structure for a laminated capacitor comprising:
    a laminated capacitor including:
        a rectangular or substantially rectangular parallelepiped-shaped base body including a top surface and a bottom surface facing each other, a pair of end surfaces perpendicular or substantially perpendicular to the top surface and the bottom surface and facing each other, and a pair of side surfaces perpendicular or substantially perpendicular to the bottom surface and the pair of end surfaces and facing each other; and
        first and second outer electrodes respectively extending from the pair of end surfaces to the bottom surface of the base body; and
    a substrate including:
        a mounting surface on which the laminated capacitor is mounted with the bottom surface facing the mounting surface; and
        a first land pattern and a second land pattern provided on the mounting surface and respectively bonded to the first and second outer electrodes; wherein
    each of the first land pattern and the second land pattern includes a first conductor pattern and a second conductor pattern separated from each other in a direction of connecting the pair of side surfaces and a third conductor pattern provided between the first conductor pattern and the second conductor pattern;
    the first conductor pattern and the second conductor pattern are bonded to first ridgeline portions of the respective first and second outer electrodes provided on the bottom surface and overlapping the pair of side surfaces as viewed in a direction perpendicular or substantially perpendicular to the top surface;
    the third conductor pattern overlaps at least one of the first and second outer electrodes as viewed in a direction perpendicular or substantially perpendicular to the mounting surface;
    the first conductor pattern, the second conductor pattern, and the third conductor pattern are arranged so as not to overlap a center portion of a side of the respective first and second outer electrodes on a side closer to the pair of end surfaces as viewed in the direction perpendicular or substantially perpendicular to the mounting surface; and
    each of the first, second and third conductor patterns is exposed and directly bonded to a respective one of the first and second outer electrodes via solder.

2. The mounting structure for a laminated capacitor according to claim 1, wherein the first conductor pattern and the second conductor pattern are bonded to corner portions defined by the first ridgeline portions and a second ridgeline portion of the respective first and second outer electrodes provided on the bottom surface and overlapping the pair of end surfaces as viewed in the direction perpendicular or substantially perpendicular to the top surface.

3. The mounting structure for a laminated capacitor according to claim 1, wherein the third conductor pattern is connected to at least one of the first conductor pattern and the second conductor pattern.

4. The mounting structure for a laminated capacitor according to claim 1, wherein each of the first land pattern and the second land pattern includes a conductor non-forming region having a circular or substantially circular arc shape and surrounded by the first conductor pattern, the second conductor pattern, and the third conductor pattern as viewed in the direction perpendicular or substantially perpendicular to the mounting surface.

5. The mounting structure for a laminated capacitor according to claim 4, wherein the substrate includes grooves each having a same or substantially a same shape as the circular or substantially circular arc shape and located immediately under the conductor non-forming region.

6. The mounting structure for a laminated capacitor according to claim 1, wherein the base body of the laminated capacitor includes flat or substantially flat plate-shaped inner conductors provided therein and extending along planes that are perpendicular or substantially perpendicular to the mounting surface of the substrate.

7. The mounting structure for a laminated capacitor according to claim 1, wherein the third conductor pattern is connected to both of the first conductor pattern and the second conductor pattern.

8. The mounting structure for a laminated capacitor according to claim 1, wherein the base body of the laminated capacitor includes flat or substantially flat plate-shaped inner conductors provided therein and extending along planes that are parallel or substantially parallel to the mounting surface of the substrate.

9. A mounting land structure comprising:
    a substrate including a mounting surface on which a laminated capacitor is mounted, a rectangular or substantially rectangular parallelepiped-shaped base body including a top surface and a bottom surface facing each other, a pair of end surfaces perpendicular or substantially perpendicular to the top surface and the bottom surface and facing each other, and a pair of side surfaces perpendicular or substantially perpendicular to the bottom surface and the pair of end surfaces and facing each other, and first and second outer electrodes respectively extending from the pair end surfaces to the bottom surface of the base body; and a first land pattern and a second land pattern provided on the mounting surface so as to be respectively bonded to the first and second outer electrodes; wherein each of the first land pattern and the second land pattern includes a first conductor pattern and a second conductor pattern separated from each other in a direction of connecting the pair of side surfaces and a third conductor pattern provided between the first conductor pattern and the second conductor pattern;

the first conductor pattern and the second conductor pattern include respective portions arranged to be bonded to first ridgeline portions of the respective first and second outer electrodes provided on the bottom surface and overlapping the pair of side surfaces as viewed in a direction perpendicular or substantially perpendicular to the top surface;

the third conductor pattern overlaps at least one of the first and second outer electrodes as viewed in a direction perpendicular or substantially perpendicular to the mounting surface;

the first conductor pattern, the second conductor pattern, and the third conductor pattern are arranged so as not to overlap a center portion of a side of the respective first and second outer electrodes on a side of the pair of end surfaces as viewed in the direction perpendicular or substantially perpendicular to the mounting surface; and each of the first, second and third conductor patterns is exposed and directly bonded to a respective one of the first and second outer electrodes via solder.

10. The mounting land structure according to claim 9, wherein each of the first land pattern and the second land pattern includes a conductor non-forming region having a circular or substantially circular arc shape and surrounded by the first conductor pattern, the second conductor pattern, and the third conductor pattern as viewed in the direction perpendicular or substantially perpendicular to the mounting surface.

11. The mounting land structure according to claim 10, wherein the substrate has grooves each having same or substantially a same shape as the circular or substantially circular arc shape and located immediately under the conductor non-forming region as viewed in the direction perpendicular or substantially perpendicular to the mounting surface.

12. The mounting land structure according to claim 9, wherein the first conductor pattern and the second conductor pattern are bonded to corner portions defined by the first ridgeline portions and a second ridgeline portion of the respective first and second outer electrodes provided on the bottom surface and overlapping the pair of end surfaces as viewed in the direction perpendicular or substantially perpendicular to the top surface.

13. The mounting land structure according to claim 9, wherein the third conductor pattern is connected to at least one of the first conductor pattern and the second conductor pattern.

14. The mounting structure according to claim 9, wherein the base body of the laminated capacitor includes flat or substantially flat plate-shaped inner conductors provided therein and extending along planes that are perpendicular or substantially perpendicular to the mounting surface of the substrate.

15. The mounting land structure according to claim 9, wherein the third conductor pattern is connected to both of the first conductor pattern and the second conductor pattern.

16. The mounting land structure according to claim 9, wherein the base body of the laminated capacitor includes flat or substantially flat plate-shaped inner conductors provided therein and extending along planes that are parallel or substantially parallel to the mounting surface of the substrate.

17. A mounting structure for a laminated capacitor comprising:
a laminated capacitor including:
a rectangular or substantially rectangular parallelepiped-shaped base body including a top surface and a bottom surface facing each other, a pair of end surfaces perpendicular or substantially perpendicular to the top surface and the bottom surface and facing each other, and a pair of side surfaces perpendicular or substantially perpendicular to the bottom surface and the end surfaces and facing each other and;
first and second outer electrodes respectively extending from the pair of end surfaces to the bottom surface of the base body; and
a substrate including:
a mounting surface on which the laminated capacitor is with the bottom surface facing the mounting surface; and
a first land pattern and a second land pattern provided on the mounting surface so as to be respectively bonded to the first and second outer electrodes; wherein
each of the first land pattern and the second land pattern includes a first conductor pattern and a second conductor pattern separated from each other in a direction of connecting the pair of side surfaces;
the first conductor pattern and the second conductor pattern are bonded to first ridgeline portions of the respective first and second outer electrodes provided on the bottom surface and overlapping the pair of side surfaces as viewed in a direction perpendicular or substantially perpendicular to the top surface;
the first conductor pattern and the second conductor pattern are arranged so as not to overlap a center portion of a side of the respective first and second outer electrodes on a side of the pair of end surfaces as viewed in a direction perpendicular or substantially perpendicular to the mounting surface;
the first land pattern and the second land pattern include respective portions recessed in a circular or substantially circular arc shape as if cut along a circumference of a single circle; and
the substrate includes grooves each having a shape cut along the single circle as viewed in the direction perpendicular or substantially perpendicular to the mounting surface.

18. A mounting land structure comprising:
a substrate including a mounting surface on which a laminated capacitor is laminated that includes a rectangular or substantially rectangular parallelepiped-shaped base body including a top surface and a bottom surface facing each other, a pair of end surfaces perpendicular or substantially perpendicular to the top surface and the bottom surface and facing each other, and a pair of side surfaces perpendicular or substantially perpendicular to the bottom surface and the pair of end surfaces and facing each other, and first and second outer electrodes respectively extending from the pair of end surfaces to the bottom surface of the base body; and a first land pattern and a second land pattern provided on the mounting surface to be respectively bonded to the first and second outer electrodes;

each of the first land pattern and the second land pattern includes a first conductor pattern and a second conductor pattern separated from each other in a direction of connecting the pair of side surfaces;

the first conductor pattern and the second conductor pattern include respective portions to be bonded to first ridgeline portions of the respective first and second outer electrodes provided on the bottom surface and overlapping the pair of side surfaces as viewed in the direction perpendicular or substantially perpendicular to the top surface;

the first conductor pattern and the second conductor pattern are arranged so as not to overlap a center portion of a side of the respective first and second outer electrodes on a side of the pair of end surfaces as viewed in the direction perpendicular or substantially perpendicular to the mounting surface;

the first conductor pattern and the second conductor pattern are bonded to corner portions defined by the first ridgeline portions and a second ridgeline portion of the respective first and second outer electrodes provided on the bottom surface and overlapping the pair of end surfaces as viewed in the direction perpendicular or substantially perpendicular to the top surface;

the first land pattern and the second land pattern include respective portions recessed in a circular or substantially circular arc shape as if cut along a circumference of a single circle; and the substrate includes grooves each having a shape cut along the single circle as viewed in the direction perpendicular or substantially perpendicular to the mounting surface.

\* \* \* \* \*